(12) United States Patent
Arita et al.

(10) Patent No.: US 9,513,313 B2
(45) Date of Patent: Dec. 6, 2016

(54) METHOD FOR INSPECTING ELECTRONIC DEVICE AND ELECTRONIC DEVICE INSPECTION APPARATUS

(75) Inventors: Hiroaki Arita, Fuchu (JP); Osamu Masuda, Machida (JP)

(73) Assignee: KONICA MINOLTA, INC., Tokyo (JP)

( * ) Notice: Subject to any disclaimer, the term of this patent is extended or adjusted under 35 U.S.C. 154(b) by 421 days.

(21) Appl. No.: 14/125,562

(22) PCT Filed: May 23, 2012

(86) PCT No.: PCT/JP2012/063126
§ 371 (c)(1),
(2), (4) Date: Dec. 11, 2013

(87) PCT Pub. No.: WO2012/172938
PCT Pub. Date: Dec. 20, 2012

(65) Prior Publication Data
US 2014/0139253 A1 May 22, 2014

(30) Foreign Application Priority Data

Jun. 14, 2011 (JP) ................................. 2011-131752

(51) Int. Cl.
| | |
|---|---|
| G01R 1/02 | (2006.01) |
| H01L 21/66 | (2006.01) |
| G01R 31/01 | (2006.01) |
| H02S 50/10 | (2014.01) |
| G09G 3/00 | (2006.01) |
| G02F 1/13 | (2006.01) |
| G09G 3/32 | (2016.01) |

(52) U.S. Cl.
CPC ................. *G01R 1/02* (2013.01); *G01R 31/01* (2013.01); *G02F 1/1309* (2013.01); *G09G 3/006* (2013.01); *H01L 22/30* (2013.01); *H02S 50/10* (2014.12); *G09G 3/3208* (2013.01); *Y02E 10/542* (2013.01)

(58) Field of Classification Search
CPC .......... G01R 1/02; H01L 22/30; G02F 1/1309; G09G 3/006
USPC ...................................... 324/757.01
See application file for complete search history.

(56) References Cited

U.S. PATENT DOCUMENTS

2006/0103371 A1* 5/2006 Manz ...................... H02S 50/10
324/757.01

FOREIGN PATENT DOCUMENTS

| DE | 102007006274 A1 | 8/2008 |
|---|---|---|
| JP | 2-062972 A | 3/1990 |
| JP | 08152446 A | 6/1996 |
| JP | 10-26644 A | 1/1998 |
| JP | 2000-241495 A | 9/2000 |
| JP | 2005-134421 A | 5/2005 |
| JP | 2005-233788 A | 9/2005 |
| JP | 2005-249425 A | 9/2005 |

(Continued)

OTHER PUBLICATIONS

Machine translation of DE 102007006274A1 Aug. 2008.*

(Continued)

*Primary Examiner* — Christ Mahoney
(74) *Attorney, Agent, or Firm* — Holtz, Holtz & Volek PC (57) ABSTRACT

A method for inspecting an electronic device, in which inspection of electrical characteristics is carried out, uses conduction to pass a current to an electronic device while the electronic device is being continuously conveyed.

8 Claims, 9 Drawing Sheets (56) References Cited

FOREIGN PATENT DOCUMENTS

| JP | 2007-012357 A | 1/2007 |
| JP | 2008-089394 A | 4/2008 |
| WO | WO 2009/050803 A1 | 4/2009 |

OTHER PUBLICATIONS

Japanese Office Action (and English translation thereof) dated Sep. 8, 2015, issued in counterpart Japanese Application No. 2013-520487.
Japanese Office Action (and English translation thereof) dated Dec. 1, 2015, issued in counterpart Japanese Application No. 2013-520487.
European Office Action dated Dec. 17, 2015, issued in counterpart European Application No. 12800543.6.
International Preliminary Report on Patentability (IPRP) dated Dec. 17, 2013 (and English translation thereof) issued in International Application No. PCT/JP2012/063126.
International Search Report (ISR) dated Aug. 21, 2012 (and English translation thereof) issued in International Application No. PCT/JP2012/063126.

\* cited by examiner

METHOD FOR INSPECTING ELECTRONIC
DEVICE AND ELECTRONIC DEVICE
INSPECTION APPARATUS

TECHNICAL FIELD

The present invention relates to a method for inspecting an electronic device and an electronic device inspection apparatus.

BACKGROUND ART

Conventionally, electronic devices such as an organic electroluminescence element, a solar cell, a secondary cell and electronic paper have been manufactured by vapor deposition, a wet process (spin coating method, casting method, ink-jet method, spraying method, printing method) and such like (hereinafter, also called a coating method), which have been performed by batch production or single sheet production. Thus, an inspection process of electrical characteristics and such like of the electronic devices has been also performed by the batch or sheet.

As the inspection process, specifically, there has been known a technique of sequentially receiving an inspection pallet loaded with a plurality of light emitting panels which are set to conduct a current and performing determination of the inspection of electrical and optical characteristics for each of the light emitting panels (for example, see patent document 1).

However, instead of such batch production and single sheet production, attention has been recently paid to production by a so-called roll-to-roll system of performing coating on a rolled film (continuous flexible substrate) since it facilitates continuous production.

The roll-to-roll system which has higher productivity than that of the batch production and the single sheet production is also desired in the above inspection process of electronic devices. However, even when produced by the roll-to-roll system, each of the electronic devices is actually conveyed intermittently to be inspected. As an example, there is a technique of intermittently conveying, in the longer direction, a tape-shaped thin film successively formed of a plurality of film substrates on which semiconductor chips are mounted and performing functional verification for each of the semiconductor chips (see patent document 1, for example). Thus, the inspection process is normally performed by the intermittent inspection of single sheet or roll-to-roll, which does not sufficiently make use of merits of high productivity of the roll-to-roll system.

On the other hand, there is known an apparatus which can appropriately measure the surface resistivity of a conductive sheet by conveying the long conductive sheet, though it is not the electronic devices (see patent document 3, for example). In such case, since the conductive sheet is used, electricity can pass thoroughly, the current can be conducted easily by a conduction unit contacting appropriate portions of the conductive sheet, and the surface conductivity can be measured.

PRIOR ART DOCUMENTS

Patent Documents

[Patent Document 1] Japanese Patent Application Laid Open Publication No. 2005-249425
[Patent Document 2] Japanese Patent Application Laid Open Publication No. 2008-89394
[Patent Document 3] Japanese Patent Application Laid Open Publication No. H10-26644

DISCLOSURE OF THE INVENTION

Problems to be Solved by the Invention

In a case of a conductive sheet as in the above-mentioned patent document 3, the inspection thereof is possible by the conduction unit contacting the appropriate portions of the conductive sheet; however, in a case where electrodes are provided at specific positions as in an electronic device, the inspection thereof needs positioning of the conduction unit so as to contact the electrodes at the positions specific to the electronic device.

Thus, when inspecting the electronic device, the apparatus as in the above patent document 3 used for the conductive sheet cannot be used and positioning of the conduction unit is necessary, and thus intermittent inspection has to be performed even when the electronic device is produced by the single sheet or the roll-to-roll. Thus, the inspection process requires time and it is impossible to make use of merits of high productivity when producing the electronic device by the roll-to-roll system.

The present invention was made in consideration of the above matters and an object of the present invention is to provide a method for inspecting an electronic device and an electronic device inspection apparatus which can perform a rapid and 100-percent inspection of electrical characteristics of the electronic device continuously conveyed by the roll-to-roll system and can make use of merits of high productivity.

Means for Solving the Problem

In order to achieve the above object, the invention of claim 1 is characterized in performing electric conduction to the electronic device by using a conduction unit to carry out an inspection of an electrical characteristic while the electronic device is being continuously conveyed.

The invention of claim 2 is characterized in that, in the method for inspecting the electronic device of claim 1, the inspection of the electrical characteristic is carried out by the conduction unit and the electronic device continuously contacting each other to perform the electric conduction in a state where the conduction unit is fixed.

The invention of claim 3 is characterized in that, in the method for inspecting the electronic device of claim 1, the inspection of the electrical characteristic is carried out by synchronizing the conduction unit with conveyance of the electronic device so that the conduction unit and the electronic device continuously contact each other to perform the electric conduction.

The invention of claim 4 is characterized in that, in the method for inspecting the electronic device of any one of claims 1 to 3, a plurality of the electronic devices are provided on a substrate and conveyed.

The invention of claim 5 is characterized in that, in the method for inspecting the electronic device of any one of claims 1 to 4, a substrate is a resin film, a metal foil or a glass.

The invention of claim 6 is characterized in that, in the method for inspecting the electronic device of any one of claims 1 to 5, the electronic device is an organic electronic device.

The invention of claim 7 is characterized in that, in the method for inspecting the electronic device of any one of claims 1 to 6, the inspection of the electrical characteristic is carried out by detecting luminescence from the electronic device due to the electric conduction.

The invention of claim 8 is characterized in comprising: a conveying unit which continuously conveys an electronic device; a conduction unit which performs electric conduction to the electronic device which is continuously conveyed by the conveying unit; and an electrical characteristic inspection unit which carries out an inspection of an electrical characteristic of the electronic device to which the electric conduction is performed by the conduction unit.

Effects of the Invention

According to the present invention, a rapid and 100-percent electrical characteristic inspection of electronic device can be performed on electronic devices which are continuously conveyed by the roll-to-roll system, and thus it is possible to make use of the merits of high productivity.

EMBODIMENTS FOR CARRYING OUT THE INVENTION

Hereinafter, an embodiment of the present invention will be described with reference to the drawings.

First, an electronic device to be used in an inspection method of electronic device of the present invention will be described.
<Electronic Device>

Figure 1:
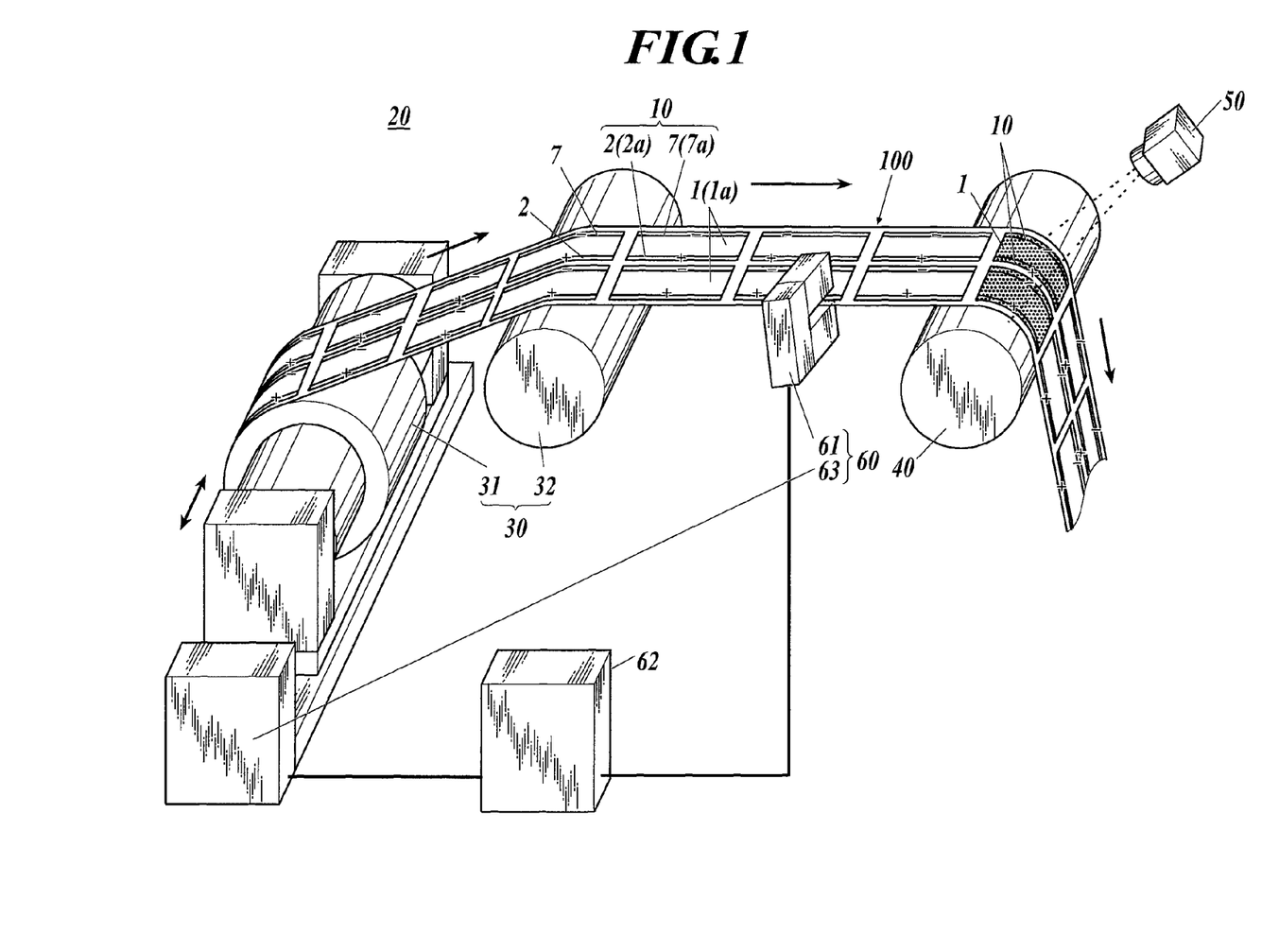
[FIG. 1] This is an external schematic view of electronic devices and an electronic device inspection apparatus.

FIG. 1 is an external schematic view of electronic devices and an electronic device inspection apparatus.

The electronic device is a display element, a light, a primary cell, a secondary cell, a solar cell, a non-volatile memory and a switching element, for example, and a preferable one among them is a printed electronic device such as an organic electroluminescence panel (hereinafter, called an organic EL panel), an organic thin-film solar cell, a dye-sensitized solar cell, an electronic paper, a secondary cell or an organic TFT.

As shown in FIG. 1, a plurality of electronic devices 1 are provided on a long substrate 100. Each of the electronic devices 1 is in a nearly rectangle in a plan view extending in the longer direction of the substrate 100. Then, the electronic devices 1 are provided in two lines in the width direction with predetermined intervals along the longer direction on the substrate 100.

An electrode 10 (anode 2 and cathode 7) is formed on each of the electronic devices 1. In a case of FIG. 1, the anode 2 is formed on a side edge portion and the cathode 7 is formed on the other side edge portion in the longer direction of each of the electronic devices 1. That is, the anodes 2 of the electronic devices 1 are located in lines along the longer direction and the cathodes 7 of the electronic devices 1 are also located in lines along the longer direction.

As the substrate 100, for example, a resin film, a metal foil and a glass are suggested and a long flexible material is especially preferable.

Hereinafter, the configuration in a case where the electronic device is an organic EL panel will be described.

Figure 2A:
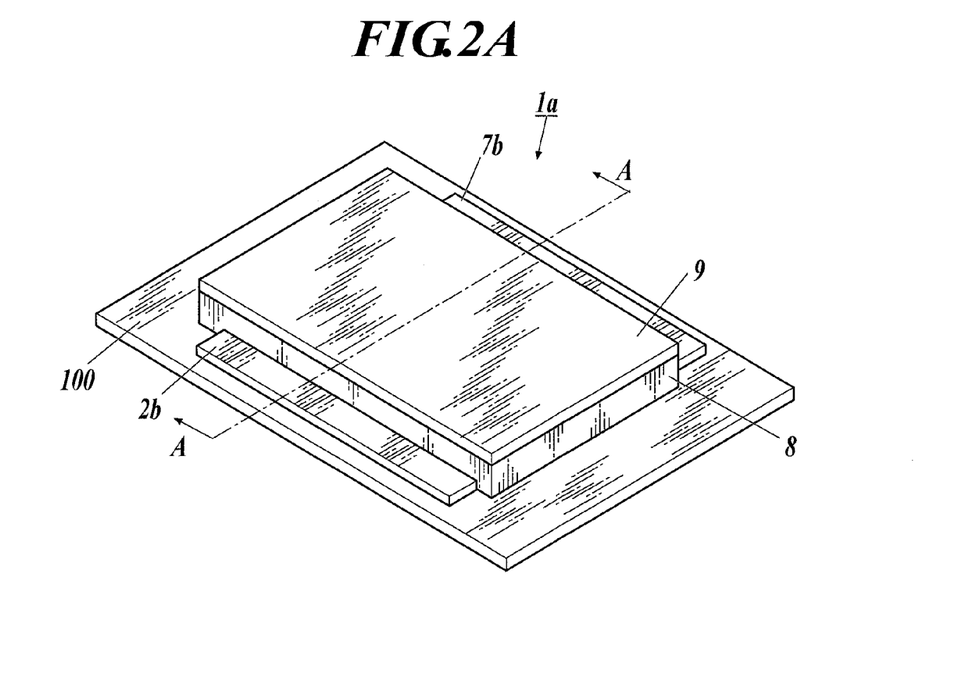
[FIG. 2A] This is a schematic view showing a schematic configuration of an organic EL panel.
Figure 2B:
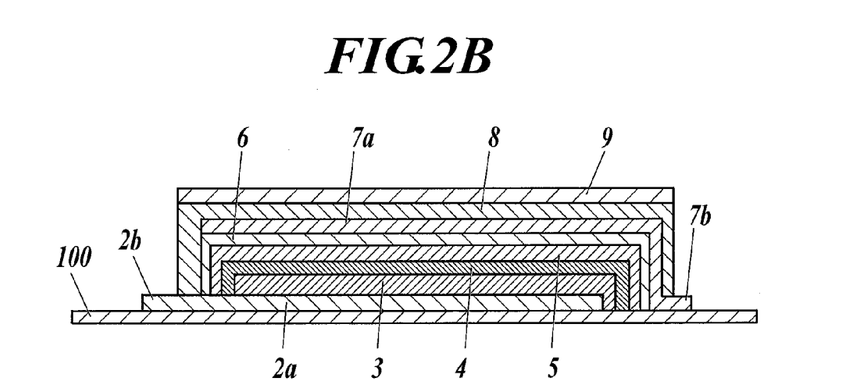
[FIG. 2B] This is a schematic sectional view of FIG. 2A cut along the line A-A.

FIG. 2A is a schematic view showing a schematic configuration of an organic EL panel and FIG. 2B is a schematic sectional view of FIG. 2A cut along the line A-A.

As shown in FIGS. 2A and 2B, an organic EL panel 1a includes an anode 2a, a hole transport layer 3, a luminescent layer 4, an electron transport layer 5, a cathode buffer layer (electron injection layer) 6, a cathode 7a, an adhesive layer 8 and a sealing member 9 in order on the substrate 100.

The anode 2a is formed of ITO including an oxide of indium and tin, for example.

An organic functional layer is formed of the hole transport layer 3, the luminescent layer 4, the electron transport layer 5 and the cathode buffer layer 6. The organic functional layer can be configured by including at least the luminescent layer 4. By conducting electrical current to such organic functional layer (luminescent layer 4), the luminescent material inside the luminescent layer 4 emits light. In addition, a sealing layer is formed of the adhesive layer 8 and the sealing member 9.

The cathode 7a is formed of an inorganic material such as aluminum, for example.

As described above, the organic EL panel 1a indicates a state where the cathode 7a is sealed with the sealing member 9 via the adhesive layer 8, and the organic EL element indicates a state where the components up to the cathode 7a are formed.

Next, an electronic device inspection apparatus used in the inspection method of the electronic device of the present invention will be described.
<Electronic Device Inspection Apparatus>

As shown in FIG. 1, an electronic device inspection apparatus 20 is an apparatus of inspecting electrical characteristics by continuously conducting electrical current to the plurality of electronic devices 1 on the substrate 100 which is continuously conveyed by the roll-to-roll system after forming the plurality of electronic devices 1 on the substrate 100 by the roll-to-roll system and before packaging the electronic devices 1.

For example, in a case where each of the electronic devices 1 is the above organic EL panel 1a, the organic functional layer (luminescent layer 4) emits light by the electrical current passing between the anode 2a and the cathode 7a, and the electrical characteristics are inspected.

Here, for example, the electrical characteristic inspection is performed by inspecting luminescence (ultraviolet light, visible light and infrared light) from the electronic device 1 by the electric conduction. Specifically, the electrical characteristic inspection includes IV inspection (current-voltage test), IVL inspection (current-voltage luminance test), light emission luminance inspection, inspection of dark spot and bright spot (luminescent spot), leakage inspection, unevenness inspection, color temperature, defect inspection and such like.

The electronic device inspection apparatus 20 includes a conveying unit 30 which continuously conveys the substrate 100 provided with a plurality of electronic devices 1, a conducting roll 40 for conducting electrical current to the electronic devices 1 of the substrate 100 conveyed by the conveying unit 30 and an electrical characteristic inspection unit 50 for inspecting electrical characteristics of the electronic devices 1.

The conveying unit 30 includes a delivery roll 31 which delivers the substrate 100 provided with the plurality of electronic devices 1, a guide roll 32 which supports the delivered substrate 100, a wind-up roll (not shown in the drawings) which winds up the substrate 100 after inspection, and a driving source (not shown in the drawings) such as a motor which drives the delivery roll 31, the guide roll 32 and the wind-up roll, for example.

The conducting roll 40 is provided in a state of being fixed between the guide roll. 32 and the wind-up roll. The conducting roll 40 is rotatable to support the conveyed substrate 100 at the surface and deliver the conveyed substrate 100 in the conveyance direction. On the surface of the conducting roll 40, an electrode 41 is formed as a conduction unit with respect to the electrodes 10 (anodes 2 and cathodes 7) of the electronic devices 1 (see FIG. 3A). The conveyed substrate 100 is supported on the surface of the conducting roll 40, and electrical current is conducted by the electrodes 10 of the electronic devices 1 contacting the electrode 41 (see FIG. 3A) which is formed on the surface of the conducting roll 40.

Figure 3A:
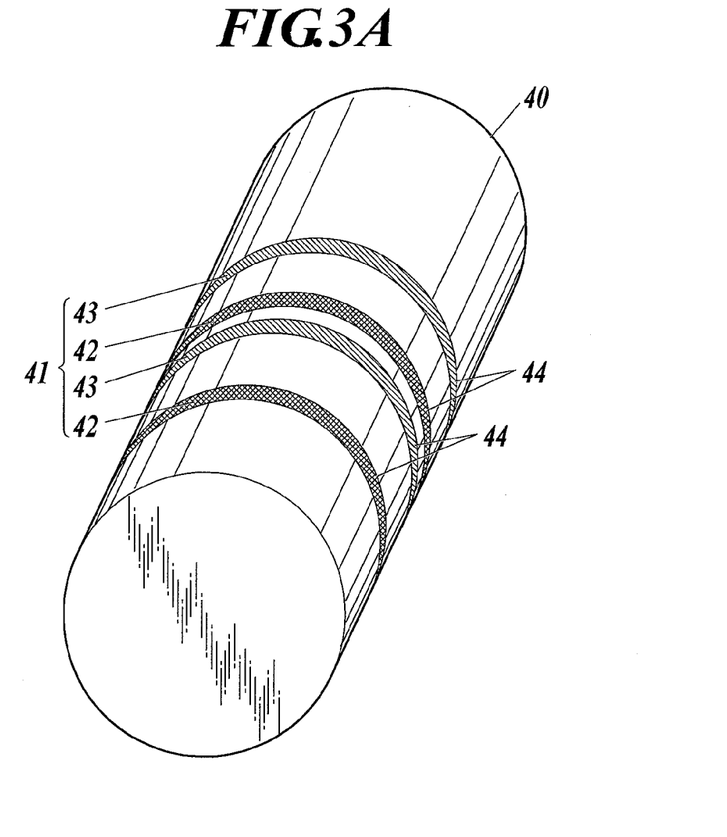
[FIG. 3A] This is an external schematic view showing electrodes of a conducting roll.
Figure 3B:
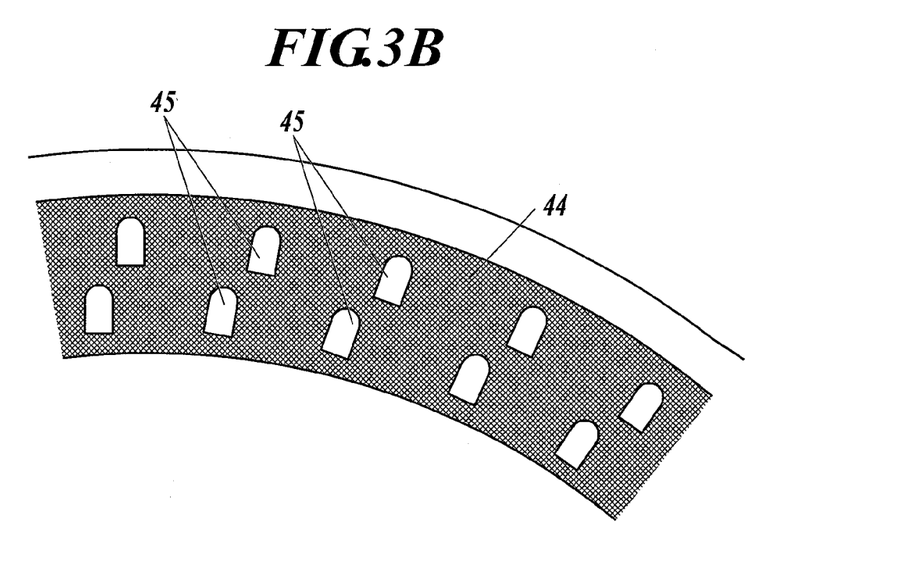
[FIG. 3B] This is an enlarged view of an electrode portion of the conducting roll of FIG. 3A.

FIG. 3A is an external schematic view showing the electrode of the conducting roll, and FIG. 3B is an enlarged view of an electrode portion of the conducting roll.

As shown in FIG. 3A, positive electrodes 42 and negative electrodes 43 of the electrode 41 of the conducting roll 40 are located alternately in the width direction of the conducting roll 40 so as to correspond to the electrodes 10 (anodes 2 and cathodes 7) of the electronic devices 1.

Specifically, grooves 44 are formed in four lines in the width direction along the circumferential direction on the surface of the conducting roll 40. Then, as shown in FIG. 3B, the electrode 41 is configured by providing a plurality of pin probes 45 of the positive electrode 42 or the negative electrode 43 in each of the grooves 44.

The pin probes 45 are connected to a feed circuit not shown in the drawings, electrical current is conducted to the pin probes 45 via the feed circuit and electrical current passes through the electronic devices 1 when the electrodes 10 of the electronic devices 1 contact the pin probes 45. When each of the electronic devices 1 is the organic EL panel 1a, the electrical current passes through the organic functional layer (luminescent layer 4) of the organic EL panel 1a to emit light.

The location of the electrode 41 (positive electrodes 42 and negative electrodes 43) of the conducting roll 40 is not limited to the above-mentioned example, and the electrode 41 is provided so as to correspond to the location of the electrodes 10 (anodes 2 and cathodes 7) of the electronic devices 1.

Figure 4:
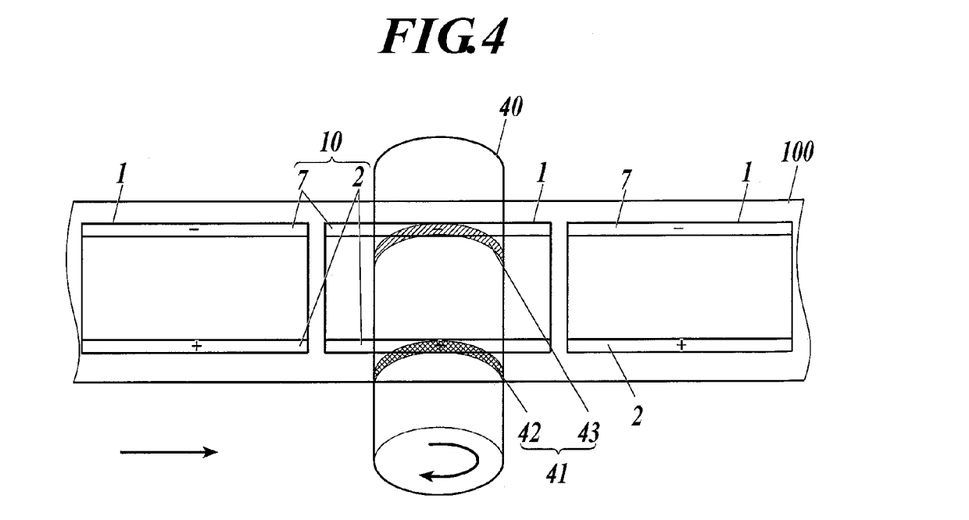
[FIG. 4] This is a diagram showing the shape of the electronic device and a location example of the electrodes of the electronic device and the conducting roll.
Figure 5:
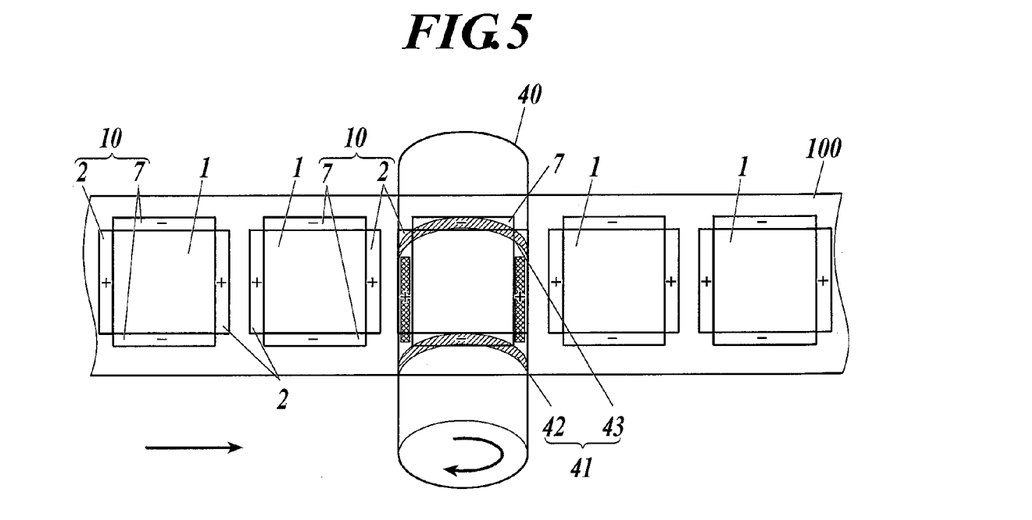
[FIG. 5] This is a diagram showing the shape of the electronic device and a location example of the electrodes of the electronic device and the conducting roll.
Figure 6:
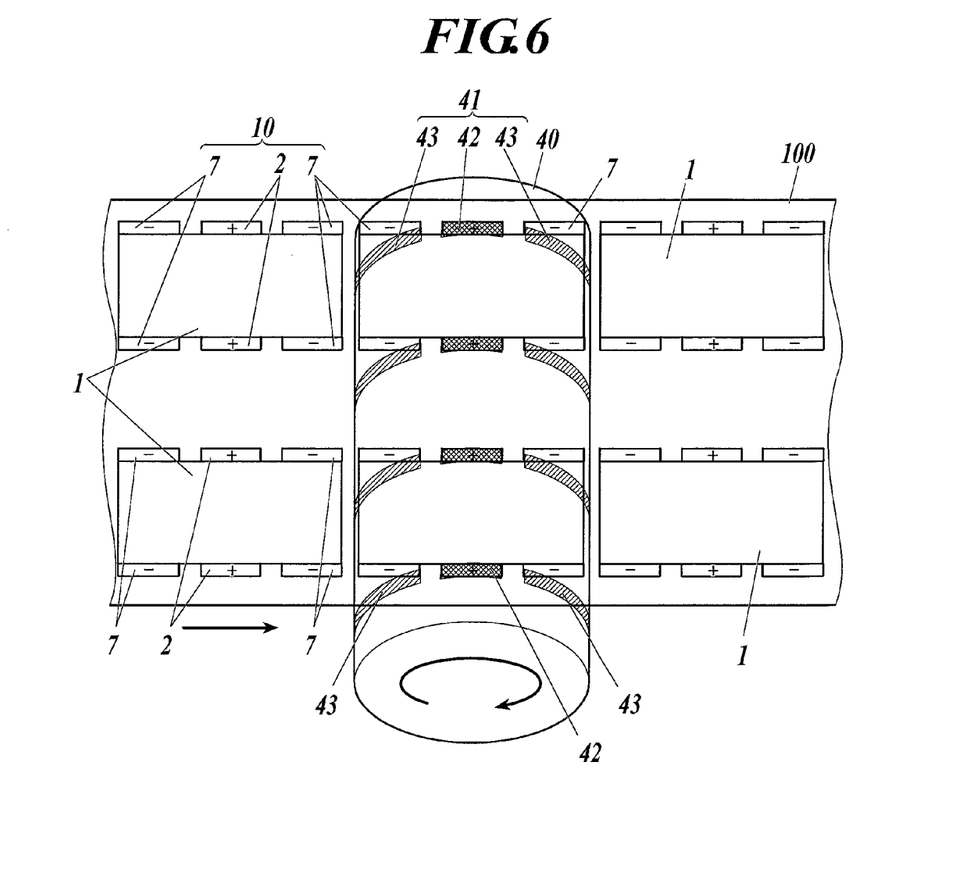
[FIG. 6] This is a diagram showing the shape of the electronic device and a location example of the electrodes of the electronic device and the conducting roll.

Here, examples shown in FIGS. 4 to 6 are examples of the shape of the electronic device 1 and location of the electrode 10 of the electronic device 1, for example. FIGS. 4 to 6 show an electrical conducting state of the electronic device and the conducting roll. In FIGS. 4 to 6, the conducting roll and the electronic devices are shown in a schematic view and a plan view, respectively, to make the electrodes of the conducting roll and the electronic devices understandable.

In FIG. 4, each of the electronic devices 1 is in a nearly rectangle in a plan view as in FIG. 1, the electronic devices 1 are provided in a line in the width direction of the substrate 100 with predetermined intervals along the longer direction. Then, the anode 2 is formed on one side edge portion in the longer direction of each of the electronic devices 1 and the cathode 7 is formed on the other side edge portion.

On the other hand, the electrode 41 of the conducting roll 40 is provided in two lines in the width direction, the positive electrode 42 is formed along the circumferential direction of the conducting roll 40 at the position corresponding to the anode 2 of the electronic device 1, and the negative electrode 43 is formed along the circumferential direction of the conducting roll 40 at the position corresponding to the cathode 7 of the electronic device 1. Accordingly, by the substrate 100 being conveyed, the electrode 10 of the electronic device 1 contacts the corresponding electrode 41 of the conducting roll 40.

In FIG. 5, each of the electronic devices 1 is in a nearly square shape in a plan view, and the plurality of electronic devices 1 are provided in a line in the width direction of the substrate 100 with predetermined intervals along the longer direction. Then, the anodes 2 and the cathodes 7 are formed on the four side edge portions of each of the electronic devices 1 so as to face each other. That is, the anodes 2 of each of the electronic devices 1 are located in a line along the longer direction and the cathodes 7 of each of the electronic devices 1 are also located in a line along the longer direction.

On the other hand, the negative electrodes 43 of the conducting roll 40 are provided in two lines in the width direction and formed at positions corresponding to the negative electrodes 7 of the electronic device 1 along the circumferential direction of the conducting roll 40. The positive electrodes 42 are provided between the two lines of negative electrodes 43 so as to extend along the width direction at positions corresponding to the positive electrodes 2 of the electronic device 1. Accordingly, by the substrate 100 being conveyed, the electrode 10 of the electronic device 1 contacts the corresponding electrode 41 of the conducting roll 40.

In FIG. 6, each of the electronic devices 1 is formed in a nearly rectangle in a plan view and the electronic devices 1 are provided in two lines in the width direction of the substrate 100 with predetermined intervals along the longer direction. Then, the cathode 7, the positive electrode 2 and the cathode 7 are located in this order with predetermined intervals on each of the side edge portions in the longer direction of each of the electronic devices 1.

On the other hand, the electrodes 41 of the conducting roll 40 are provided in four lines in the width direction in each of which the positive electrodes 42 and the negative electrodes 43 are alternately located along the circumferential direction of the conducting roll 40 so as to correspond to the electrode 10 (anode 2 and cathodes 7) of the electronic device 1. Therefore, by the substrate 100 being conveyed, the electrodes 10 of the electronic devices 1 contact the corresponding electrodes 41 of the conducting roll 40.

In FIGS. 4 to 6, though not shown in the drawings, the electrode 41 of the conducting roll 40 is configured by forming grooves 44 on the surface of the conducting roll 40 and providing a plurality of pin probes 45 of positive electrode 42 or negative electrode 43 in each of the grooves 44 as in FIGS. 3A and 3B.

As shown in FIG. 1, the electronic device inspection apparatus 20 includes a positioning unit 60 which moves the substrate 100 in the width direction of the substrate 100 to perform positioning in the width direction so that a predetermined electrode 41 of the conducting roll 40 contacts the corresponding electrodes 10 of the electronic devices 1.

The positioning unit 60 includes an EPC sensor 61 (edge position control sensor), an amplifier unit 62 and a position control unit 63, for example.

Specifically, the EPC sensor 61 is provided near the upstream side of the conducting roll 40 so as to detect the movement of the edge position in the width direction of the substrate 100 and output the edge position information to the amplifier unit 62. The amplifier unit 62 is connected to the position control unit 63. The position control unit 63 moves the delivery roll 31 in the width direction to move the position in the width direction of the substrate 100 and controls so that the electrodes 10 of the electronic device 1 contact the corresponding electrode 41 of the conducting roll 40.

As the electrical characteristic inspection unit 50, a photodetector such as a line sensor which detects light emitted from the electronic device 1 can be used in a case of performing light emission luminance inspection, unevenness inspection and defect inspection.

In addition, IVL inspection can be performed by arranging a plurality of sets of conducting roll 40 and line sensor with predetermined intervals and applying a different amount of current to the conducting rolls 40 to perform luminance measurement, for example.

Furthermore, as another form, the electrical characteristic inspection can be performed by providing the electrical characteristic inspection unit 50 with a mechanism of following the conveyed substrate for a predetermined distance so as to follow the device to be measured during the measurement. In such form, in a case of the IVL inspection, voltage value (or current value) and luminance can be measured with respect to the applied current value (or voltage value) by using a luminance meter (for example, CA-2000 made by Konica Minolta Sensing). In a case of leakage inspection, the leakage inspection can be performed by detecting infrared light with an infrared camera (for example, SC325 and SC5600-M made by FLIR, and C10633-34 made by Hamamatsu Photonics) or by detecting weak luminescence with a highly sensitive CCD camera (for, example, SI-CCD made by Hamamatsu Photonics). The color temperature can be inspected by using the luminance meter.

Next, an inspection method of the electronic device 1 using the above electronic device inspection apparatus 20 will be described on the basis of FIG. 1.

<Inspection Method of Electronic Device>

When the driving source such as a motor is driven, the delivery roll 31, the guide roll 32 and the wind-up roll rotate to convey the substrate 100. The conveyed substrate 100 is supported by the conducting roll 40, and the predetermined electrode 41 of the conducting roll 40 sequentially contacts the corresponding electrodes 10 of the electronic devices 1. Thus, the current is conducted and the electrical characteristic inspection is performed. When the electronic device 1 is the organic EL panel 1a, the current passes through the organic functional layer (luminescent layer 4) of the organic EL panel 1a to emit light, and the electrical characteristics such as light emission luminance are inspected by a photodetector and such like which is the electrical characteristic inspection unit 50.

In such way, along with continuous conveyance of the substrate 100, the current is continuously conducted to each of the electronic devices 1 on the conducting roll 40 and the electrical characteristic inspection is sequentially performed. Before and during conveyance of the substrate 100, the EPC sensor 61 detects the position of the edge in the width direction of the substrate 100 and outputs the information of the edge position to the amplifier unit 62, and the position control unit 63 connected to the amplifier unit 62 controls the position in the width direction of the substrate 100 so that the corresponding electrodes 10 of the electronic devices 1 contact the electrode 41 of the conducting roll 40 on the basis of the information of the edge position.

Next, a modification example of the electronic device inspection apparatus 20 and the inspection method of the electronic device 1 will be described.

Modification Example 1

Figure 7:
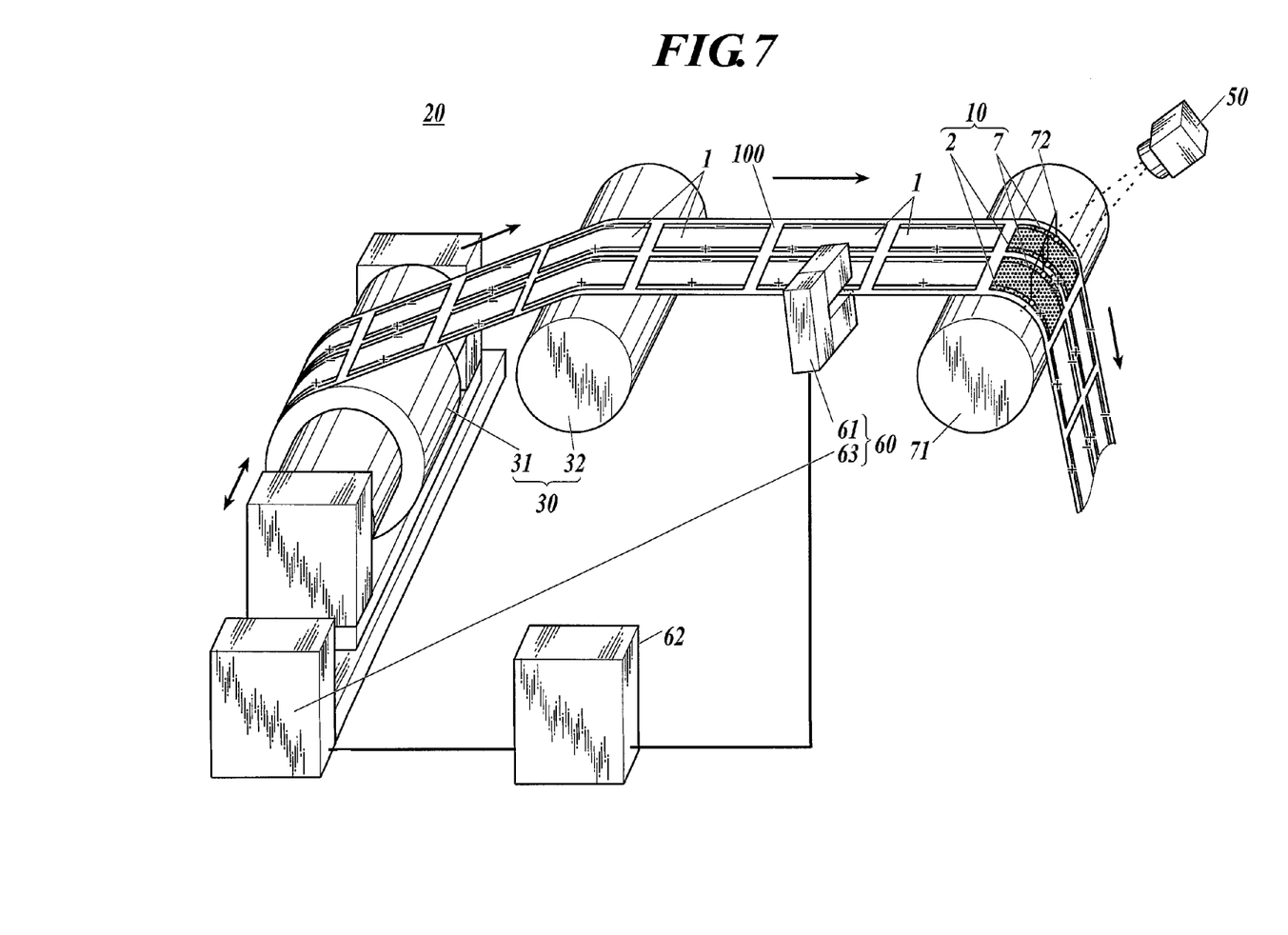
[FIG. 7] This is an external schematic view showing a modification example of the electronic devices and the electronic device inspection apparatus of FIG. 1.

FIG. 7 is an external schematic view showing a modification example of the electronic device and the electronic device inspection apparatus of FIG. 1.

Different from the electronic device inspection apparatus 20 of FIG. 1, an electronic device inspection apparatus 70 shown in FIG. 7 is configured so that the conduction unit contacts the electronic devices 1 from above.

Specifically, the conducting roll 40 of FIG. 1 is replaced with a guide roll 71 not having the electrode 41, and a probe 72 which is a conduction unit is provided above the guide roll 71 in a state of being fixed. The probe 72 is provided so as to contact the positions corresponding to the anodes 2 and the cathodes 7 of the electronic devices 1 on the conveyed substrate 100. The probe 72 is connected to the feed circuit which is not shown in the drawings and the electrical current is conducted to the probe 72 via the feed circuit.

In such electronic device inspection apparatus 70, the substrate 100 conveyed by the conveying unit 30 is supported by the guide roll 71 and the corresponding electrodes 10 of the electronic devices 1 sequentially contact the probe 72. Thus, the current is continuously conducted to perform electrical characteristic inspection.

Since the other unit such as the conveying unit 30, the electrical characteristic inspection unit 50 and the positioning unit 60 are similar to those in a case of FIG. 1, the explanation thereof is omitted.

Modification Example 2

Figure 8:
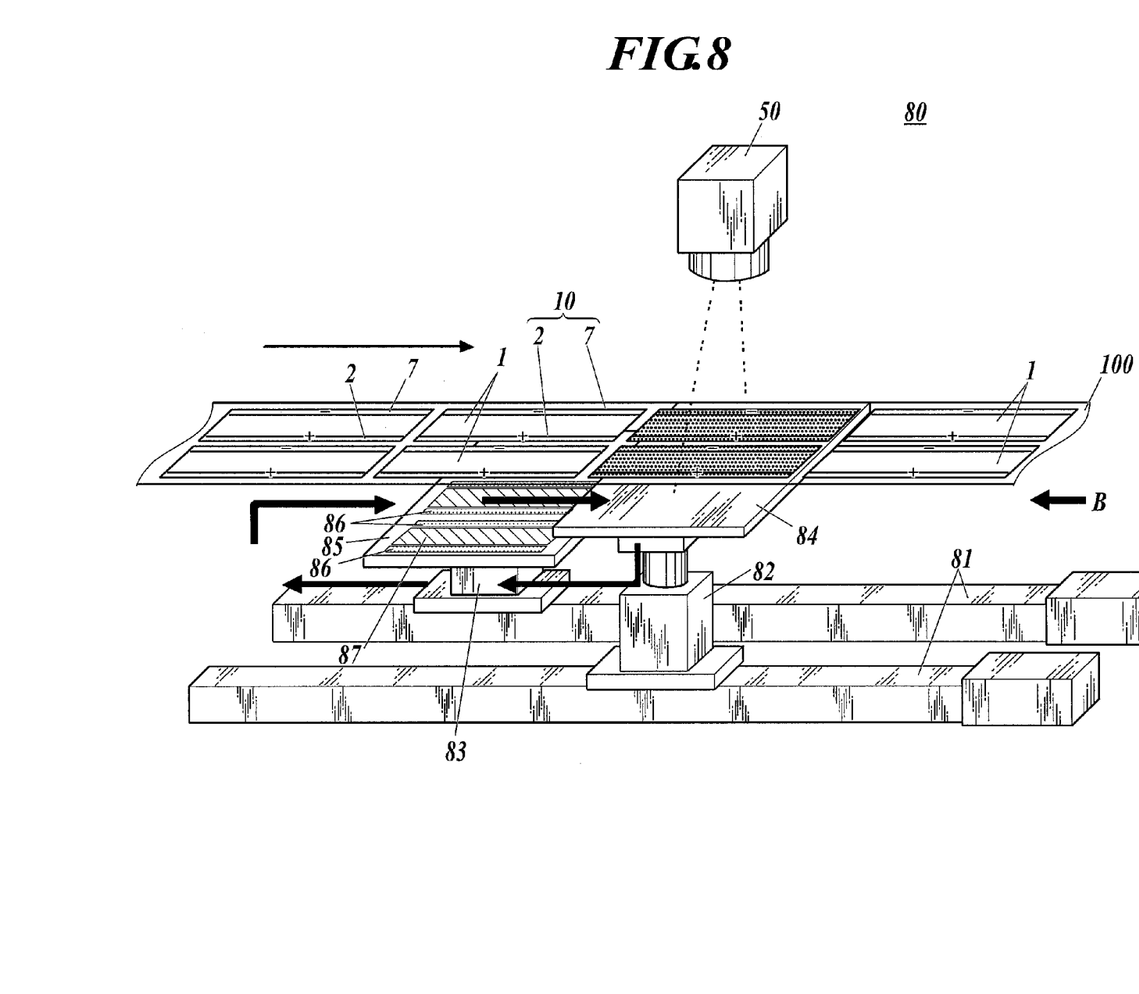
[FIG. 8] This is an external schematic view showing a modification example of the electronic devices and the electronic device inspection apparatus of FIG. 1.
Figure 9A:
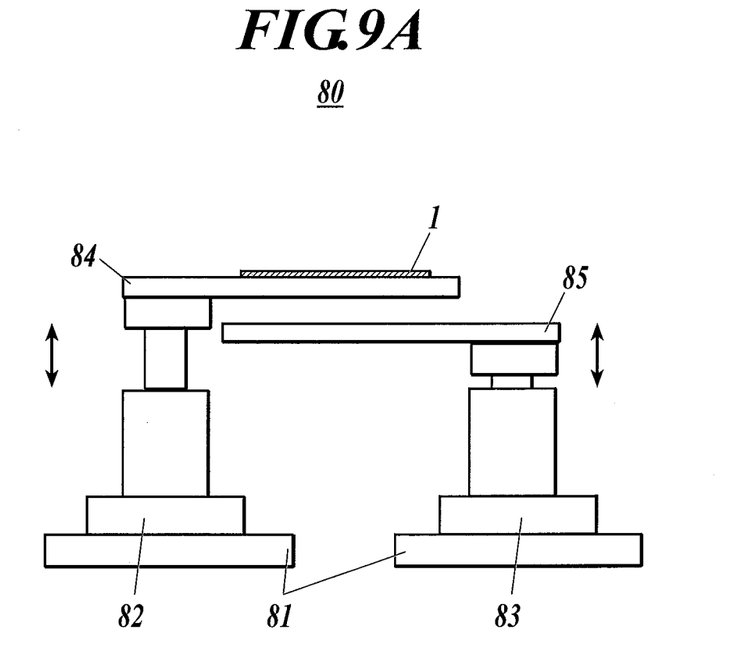
[FIG. 9A] This is a side view of FIG. 8 seen from the B direction.

FIG. 8 is an external schematic view showing a modification example of the electronic device and the electronic device inspection apparatus of FIG. 1. FIG. 9A is a side view of FIG. 8 seen from the B direction and FIG. 9B is an external schematic view of an electrode plate.

Figure 9B:
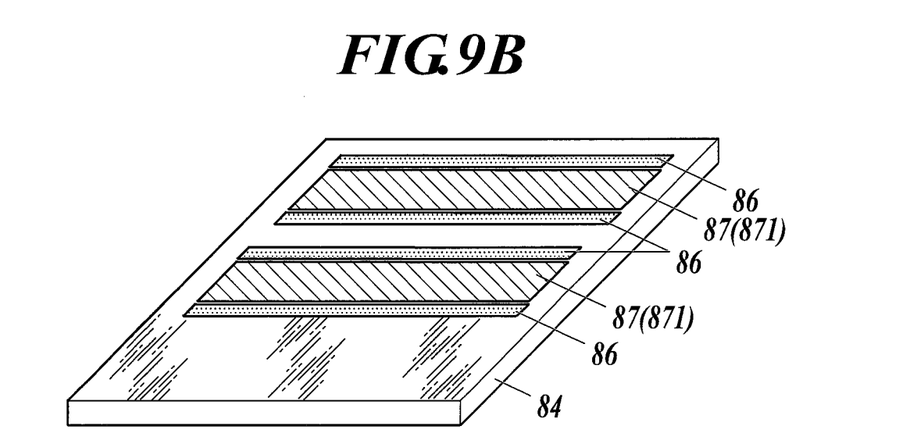
[FIG. 9B] This is an external schematic view of an electrode plate.

Different from the electronic device inspection apparatus 20 of FIG. 1, in an electronic device inspection apparatus 80 shown in FIGS. 8, 9A and 9B, the conduction unit is synchronized with the conveyance of the electronic devices 1 (substrate 100) and conducts electrical current to the predetermined electrodes 10 of the electronic devices 1 to perform the electrical characteristic inspection. The electronic device inspection apparatus 80 is located below (on the back surface side) the substrate 100.

Specifically, the electronic device inspection apparatus 80 includes a pair of bases 81 and 81 which extend along the longer direction of the substrate 100 and are horizontally movable with respect to the conveyance direction of the substrate 100, a first stage 82 which is provided on one of the bases 81 so as to move up and down, a second stage 83 which is provided on the other base 81 so as to move up and down, and first and second electrode plates 84 and 85 which are provided on the first and second stages 82 and 83, respectively.

The pair of bases 81 and 81 is located under the substrate 100 so that the bases 81 and 81 are parallel to each other.

As shown in FIG. 9B, electrode patterns (conduction unit) 86 are formed on the upper face (surface) of the first electrode plate 84 so as to correspond to the electrodes 10 of the electronic devices 1. Also, suction units 87 which suck the lower surfaces (back surfaces) of the electronic devices 1 are formed on the upper surface of the first electrode plate 84.

The suction units 87 include suction ports 871, a suction pump (not shown in the drawings) connected to the suction ports 871 and such like, and the suction ports are absorbed to the lower surfaces of the electronic devices 1 by the suction pump being driven.

The electrode patterns (conduction unit) 86 and the suction units 87 are also formed on the upper surface of the second electrode plate 85 similarly to the first electrode plate 84. The position of the suction units 87 is not limited to that of FIG. 9B, and changes can be appropriately made as long as the electronic devices 1 can be sucked.

The first stage 82 and the second stage 83 move up and down while alternately moving in the horizontal direction so that the first and second electrode plates 84 and 85 contact the electrodes 10 of the predetermined electronic devices 1 to conduct electricity.

That is, with respect to the predetermined electronic devices 1 in the conveyed substrate 100, the first stage 82 is elevated while moving in the horizontal direction so that the first electrode plate 84 contacts the lower surfaces of the electronic devices 1 to conduct electrical current and inspection is performed. During the inspection, the second stage 83 horizontally moves to a predetermined position in the conveyance direction of the next electronic devices 1 nearest to the upstream in the conveyance direction. After the inspection is performed by the first electrode plate 84, the first stage 82 is lowered to be away from the electronic devices 1 and the second stage 83 is elevated so that the second electrode plate 85 contacts the lower surfaces of the next electronic devices 1 nearest to the upstream in the conveyance direction to conduct electrical current and inspection is performed. During the inspection by the second electrode plate 85, the first stage 82 horizontally moves to a predetermined position in the conveyance direction of the next electronic devices 1 nearest to the upstream in the conveyance direction.

In such way, by the first, stage 82 and the second stage 83 moving horizontally and going up and down sequentially, in synchronization with the conveyance of the electronic devices 1, the electrical current is continuously conducted between the first and second electrode plates 84 and 85 and the electrodes 10 of the predetermined electronic devices 1, and inspection is performed.

Since the conveying unit (not shown in the drawings) of the substrate 100 and the electrical characteristic inspection unit 50 are similar to those in a case of FIG. 1, the explanation thereof is omitted.

Modification Example 3

Figure 10:
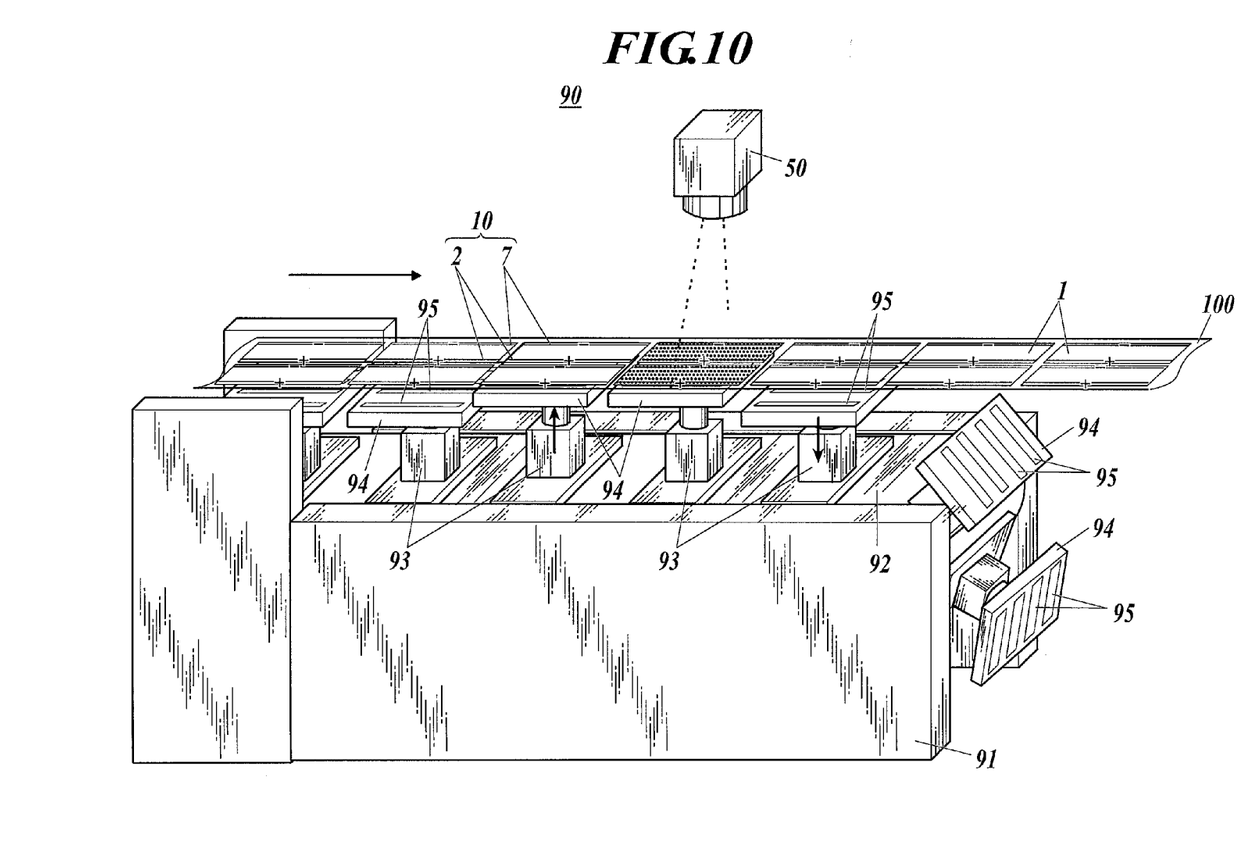
[FIG. 10] This is an external schematic view showing a modification example of the electronic devices and the electronic device inspection apparatus of FIG. 1.

FIG. 10 is an external schematic view showing a modification example of the electronic device and the electronic device inspection apparatus of FIG. 1.

In an electronic device inspection apparatus 90 shown in FIG. 10, different from the electronic device inspection apparatus 20 of FIG. 1, the conduction unit conducts electrical current to the predetermined electrodes 10 of the electronic devices 1 in synchronization with the conveyance of the electronic devices 1 (substrate 100) to perform the electrical characteristic inspection. The electronic device inspection apparatus 90 is located in a side of the substrate 100.

Specifically, the electronic device inspection apparatus 90 includes a main body 91, a driving source (not shown in the drawings) such as a motor provided on the main body 91, a plurality of driving rollers (not shown in the drawings) which rotate being driven by the motor, a rotating belt 92 wound up by the driving rollers, a plurality of stages 93 which are provided on the surface of the rotating belt 92 so as to move up and down, and electrode plates 94 which are provided on the stages 93.

The plurality of stages 93 are provided on the surface of the rotating belt 92 with predetermined intervals along the circumferential direction. The stages 93 are rotated by the rotating belt 92 and are sequentially elevated and lowered along the rotation direction.

Electrode patterns (conduction unit) 95 are formed on the upper surface (surface) of each of the electrode plates 94 so as to correspond to the electrodes 10 of the electronic devices 1 as in the above FIG. 9B. Also, suction units (not shown in the drawings) sucking the lower surfaces (back surfaces) of the electronic devices 1 may be formed on the upper surface of the electrode plate 94 as in FIG. 9B.

Among the plurality of stages 93 rotated by the rotating belt 92, the stage 93 located at a predetermined position is elevated so that the electrode plate 94 thereof contacts the lower surfaces of the electronic devices 1 to conduct electrical current and inspection is performed. After the inspection is performed, the stage 93 is lowered to be away from the electronic devices 1 and rotated by the rotating belt 92. Meanwhile, the next stage 93 is elevated so that the electrode plate 94 thereof contacts the lower surfaces of the electronic devices 1 to conduct electrical current and the inspection is performed similarly.

In such way, by the stages 93 sequentially going up and down while being rotated by the rotating belt 92, in synchronization with the conveyance of the electronic devices 1, the electrode plate 94 is continuously conducted electrically to the electrodes 10 of the predetermined electronic devices 1 to perform the inspection.

Since the conveying unit (not shown in the drawings) of the substrate 100 and the electrical characteristic inspection unit 50 are similar to those in a case of FIG. 1, the explanation thereof is omitted.

As described above, according to the embodiment, since the electrical characteristic inspection is performed by continuously conducting electrical current to the continuously conveyed electronic devices 1, electrical characteristic inspection of all the electronic devices 1 can be performed rapidly and easily. As a result, in a case where a plurality of electronic devices 1 are formed on the substrate 100 by the roll-to-roll system, the inspection process can be performed without change and it is possible to make use of the merits of high productivity.

Especially in a case of electronic device inspection apparatuses 80 and 90 shown in FIGS. 8 and 10, since the electrode patterns 86 and 95 are formed on the electrode plates 84, 85 and 94, even electrodes 10 of electronic devices 1 having a complicated shape can be easily treated by appropriately changing the position, shape and such like of the electrode patterns 86 and 95.

INDUSTRIAL APPLICABILITY

The present invention can be appropriately used for electronic devices which are continuously conveyed by the roll-to-roll system.

EXPLANATION OF REFERENCE NUMERALS

1 electronic device
1*a* organic EL panel
2 anode
7 cathode
10 electrode
20 electronic device inspection apparatus
30 conveying unit
31 deliver roll
32 guide roll
40 conducting roll
41 electrode
42 positive electrode
43 negative electrode
50 electrical characteristic inspection unit
70 electronic device inspection apparatus
72 probe
80 electronic device inspection apparatus
84 first electrode plate
85 second electrode plate
86 electrode pattern
90 electronic device inspection apparatus
94 electrode plate
95 electrode pattern
100 substrate

The invention claimed is:

1. A method for inspecting an electronic device, comprising:
continuously conveying the electronic device which is provided on a substrate;
performing position control so that an electrode of the electronic device contacts with a conduction unit by detecting a movement of a position of the substrate and moving the position of the substrate according to a detection result; and
performing electric conduction to the electronic device by using the conduction unit to carry out an inspection of an electrical characteristic while the electronic device is being continuously conveyed.

2. The method for inspecting the electronic device of claim 1, wherein the inspection of the electrical characteristic is carried out by the conduction unit and the electrode of the electronic device continuously contacting each other to perform the electric conduction in a state where the conduction unit is fixed.

3. The method for inspecting the electronic device of claim 1, wherein the inspection of the electrical characteristic is carried out by synchronizing the conduction unit with conveyance of the electronic device so that the conduction unit and the electrode of the electronic device continuously contact each other to perform the electric conduction.

4. The method for inspecting the electronic device of claim 1, wherein a plurality of the electronic devices are provided on the substrate and conveyed.

5. The method for inspecting the electronic device of claim 1, wherein the substrate is a resin film, a metal foil or a glass.

6. The method for inspecting the electronic device of claim 1, wherein the electronic device is an organic electronic device.

7. The method for inspecting the electronic device of claim 1, wherein the inspection of the electrical characteristic is carried out by detecting luminescence from the electronic device due to the electric conduction.

8. An electronic device inspection apparatus, comprising:
a conveying unit which continuously conveys an electronic device which is provided on a substrate;
a conduction unit which performs electric conduction to the electronic device which is continuously conveyed by the conveying unit;
a positioning unit which performs position control so that an electrode of the electronic device contacts with the conduction unit by detecting a movement of a position of the substrate and moving the position of the substrate according to a detection result; and
an electrical characteristic inspection unit which carries out an inspection of an electrical characteristic of the electronic device to which the electric conduction is performed by the conduction unit and whose position is controlled by the positioning unit.

* * * * *